United States Patent
Siboni et al.

(10) Patent No.: US 10,299,404 B2
(45) Date of Patent: May 21, 2019

(54) DEVICE FOR SUPPORTING AND CONNECTING ELECTRONIC CIRCUIT CARDS, COMPRISING AN ELECTRONIC CIRCUIT CARD GUIDE HAVING IMPROVED THERMAL PROPERTIES

(71) Applicant: Airbus Operations (S.A.S.), Toulouse (FR)

(72) Inventors: Laurent Siboni, Leguevin (FR); Emmanuel Bachy, Goven (FR); Vincent Dupont, Auderghem (BE)

(73) Assignee: Airbus Operations (S.A.S.), Toulouse (FR)

( * ) Notice: Subject to any disclaimer, the term of this patent is extended or adjusted under 35 U.S.C. 154(b) by 0 days.

(21) Appl. No.: 16/045,316

(22) Filed: Jul. 25, 2018

(65) Prior Publication Data
US 2019/0037726 A1    Jan. 31, 2019

(30) Foreign Application Priority Data
Jul. 27, 2017    (FR) ...................... 17 57129

(51) Int. Cl.
*H05K 7/20*    (2006.01)
*H05K 5/02*    (2006.01)

(52) U.S. Cl.
CPC ....... *H05K 7/20154* (2013.01); *H05K 5/0291* (2013.01); *H05K 7/20145* (2013.01); *H05K 7/20336* (2013.01); *H05K 7/20509* (2013.01)

(58) Field of Classification Search
CPC .......... G06F 1/20; G06F 1/181; G06F 1/1656; G06F 1/1658; G06F 1/184; G06F 1/183;
(Continued)

(56) References Cited

U.S. PATENT DOCUMENTS

| 5,398,822 A * | 3/1995 | McCarthy | H05K 7/1414 211/41.17 |
| 6,377,470 B1 * | 4/2002 | Hayward | H05K 7/1418 361/796 |

(Continued)

FOREIGN PATENT DOCUMENTS

| EP | 2 421 350 A1 | 2/2012 |
| EP | 2 448 390 A1 | 5/2012 |

(Continued)

OTHER PUBLICATIONS

French Search Report for French Application No. 1757129 dated Apr. 18, 2018.

*Primary Examiner* — Adam B Dravininkas
(74) *Attorney, Agent, or Firm* — Jenkins, Wilson, Taylor & Hunt, P.A.

(57) ABSTRACT

A device for supporting and connecting electronic circuit cards, including a metal electronic circuit card guide which has grooves, one for each electronic circuit card, each groove being configured to guide an electronic circuit card in a direction of insertion towards a connector associated with it, solid walls for linking the grooves, slots which pass through at least one wall of the electronic circuit card guide, are separated by fins and grouped to form at least one heat exchange area and are arranged and designed so as to distribute the first air flow received from below the electronic circuit card guide in at least a second air flow above the electronic circuit card guide and in contact with the electronic circuit cards.

9 Claims, 3 Drawing Sheets

(58) Field of Classification Search
CPC .......... G06F 1/187; G06F 1/185; G06F 1/186; G06F 2200/201; H05K 1/141; H05K 7/20409; H05K 9/0007; H05K 7/20436; H05K 1/0203; H05K 7/20563; H05K 7/1418; H05K 1/14; H05K 2201/043; H05K 7/20727; H05K 2201/044; H05K 7/20154; H05K 7/20145; H05K 7/20336; H05K 7/20509; H05K 5/0291
See application file for complete search history.

(56) References Cited

U.S. PATENT DOCUMENTS

| | | | | |
|---|---|---|---|---|
| 6,493,235 | B1* | 12/2002 | Barringer | H05K 7/1418 174/360 |
| 8,741,012 | B2* | 6/2014 | Rebeyrotte | H05K 7/20181 361/695 |
| 8,824,147 | B2* | 9/2014 | Caron | H05K 7/20636 165/80.4 |
| 2002/0154490 | A1* | 10/2002 | Momiyama | H05K 7/1409 361/752 |
| 2006/0126292 | A1* | 6/2006 | Pfahnl | H05K 7/20563 361/695 |
| 2012/0069519 | A1* | 3/2012 | Caron | H05K 7/20636 361/691 |
| 2012/0236499 | A1* | 9/2012 | Murayama | H04N 5/64 361/696 |
| 2012/0285132 | A1* | 11/2012 | Rebeyrotte | H05K 7/1412 55/385.1 |
| 2012/0285665 | A1* | 11/2012 | Rebeyrotte | H05K 7/1412 165/104.34 |
| 2014/0214244 | A1* | 7/2014 | Rebeyrotte | B64C 19/00 701/3 |
| 2016/0360648 | A1* | 12/2016 | Brehin | H04Q 1/09 |

FOREIGN PATENT DOCUMENTS

| | | |
|---|---|---|
| FR | 3 037 210 A1 | 12/2016 |
| FR | 3 001 603 A1 | 8/2018 |

* cited by examiner

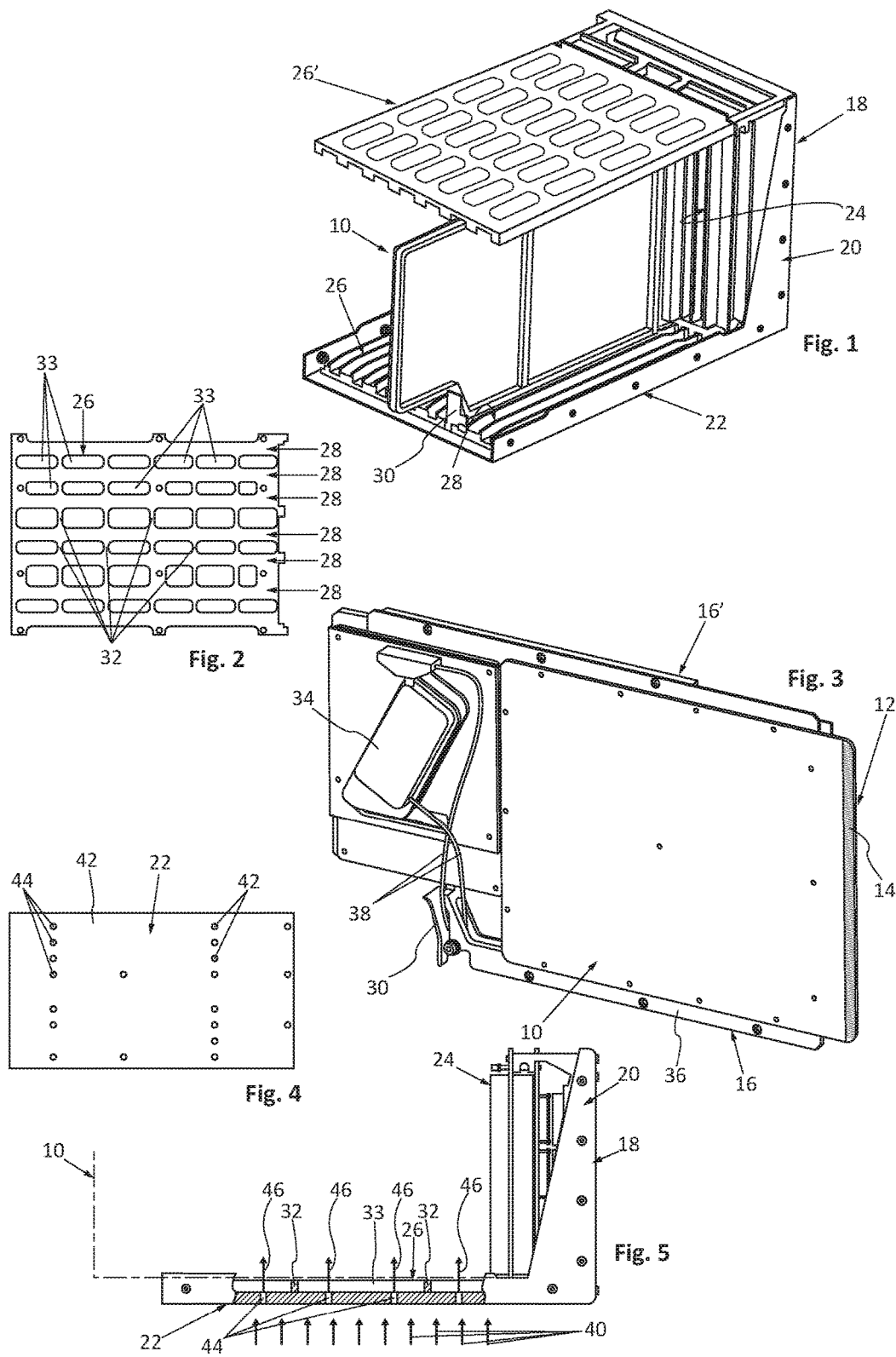

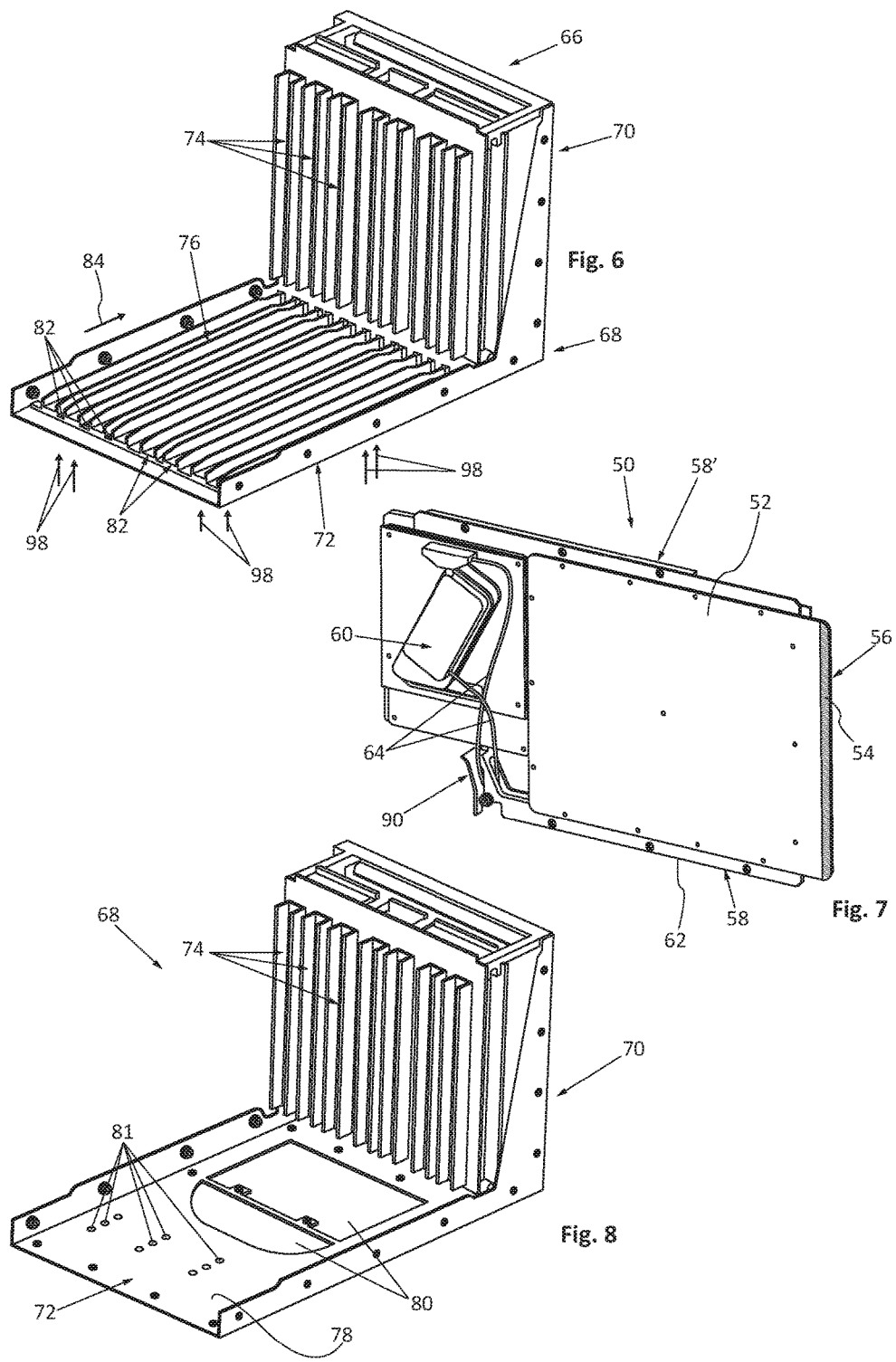

DEVICE FOR SUPPORTING AND CONNECTING ELECTRONIC CIRCUIT CARDS, COMPRISING AN ELECTRONIC CIRCUIT CARD GUIDE HAVING IMPROVED THERMAL PROPERTIES

CROSS-REFERENCE TO RELATED APPLICATION

This patent application claims priority to French patent application FR 17 57129, filed on Jul. 27, 2017, the entire disclosure of which is incorporated by reference herein.

TECHNICAL FIELD

The disclosure herein relates to a device for supporting and connecting electronic circuit cards, comprising an electronic circuit card guide having improved thermal properties.

BACKGROUND

In the aeronautical field, there are devices which are configured to support electronic circuit cards 10 and allow their connection.

According to a known embodiment illustrated in FIG. 1, a device for supporting and connecting electronic circuit cards 10 comprises:
- an electronic circuit card support 18 which is L-shaped, having a first, approximately vertical, flange 20 and a second, approximately horizontal, flange 22;
- connectors 24 positioned on the first flange 20 of the electronic circuit card support 18, at least one for each electronic circuit card 10, each being configured to receive the connection 14 of an electronic circuit card 10; and
- an electronic circuit card guide 26 which is positioned and fastened on the second flange 22 of the electronic circuit card support 18 and which is configured to guide each electronic circuit card 10 towards the connector 24 associated with it.

In one embodiment, shown in FIG. 1, the device for supporting and connecting electronic circuit cards 10 comprises a first electronic circuit card guide 26 which is positioned and fastened on the second flange 22 of the electronic circuit card support 18, and a second electronic circuit card guide 26' parallel to the first electronic circuit card guide 26, the electronic circuit cards 10 being inserted between the first and second electronic circuit card guides 26 and 26'.

Each electronic circuit card guide 26, 26' comprises a plurality of grooves 28, one for each electronic circuit card 10, each groove 28 having a U-shaped cross section configured to house the second or third edge 16, 16' of the electronic circuit card 10 and to guide the electronic circuit card 10 in a direction perpendicular to the first flange 20 of the electronic circuit card support 18, corresponding to the direction of insertion of the electronic circuit card 10.

For each electronic circuit card 10, at least one of the electronic circuit card guides 26, 26' and/or the electronic circuit card 10 comprises a locking system 30 for immobilizing the electronic circuit card 10 and preventing the withdrawal of the connection 14 of the card from the associated connector 24. The electronic circuit card guide 26 comprises a plurality of thin strips of material 32 which link the grooves 28 and extend perpendicularly to the direction of the grooves 28.

According to an embodiment shown in FIG. 3, an electronic circuit card 10 is a board on which electrical and/or electronic components are mounted, the board being approximately square or rectangular in shape and having a first edge 12, on which at least one connection 14 is positioned, and second and third edges 16, 16' configured to guide the electronic circuit card 10.

As shown in FIG. 3, at least one electronic circuit card 10 comprises a system 34 for capturing heat from the electronic circuit card 10, a heat sink 36 positioned on the second edge 16 of the electronic circuit card 10, and a heat pipe 38 for guiding the heat from the capture system 34 towards the heat sink 36. According to this embodiment, the heat emitted by the electronic circuit card 10 is transmitted by the heat sink 36 towards the electronic circuit card guide 26 and then towards the electronic circuit card support 18, which is then used to dissipate the heat.

The device for supporting and connecting electronic circuit cards 10 also comprises a distribution system for distributing a first air flow 40, to regulate the temperature of the electronic circuit cards 10. This distribution system may also be used to provide a pressure drop, commonly called a head loss.

In one embodiment, shown in FIGS. 4 and 5, the second flange 22 of the electronic circuit card support 10 takes the form of a solid plate 42.

The system for distributing the first air flow comprises a plurality of openings 44 passing through the solid plate 42. These openings 44 are arranged and designed to distribute the first air flow 40, received from below the second flange 22 and passing through it, in at least a second air flow 46 above the second flange 22 and in contact with the electronic circuit cards 10. These openings 44 of the second flange 22 of the electronic circuit card support 18 have cross sections smaller than the holes 33 delimited or defined by the grooves 28 and the thin strips of material 32 of the electronic circuit card guide 26.

To avoid interference with the system for distributing the first air flow, the thin strips of material 32 of the electronic circuit card guide 26 are spaced apart by a significant distance to allow the unrestricted passage of the air through the electronic circuit card guide 26, and their height (the dimension in a direction perpendicular to the second flange 22) is small relative to the height of the branches of the U-shaped cross section of the grooves 28.

Because of this, the heat dissipation capacity of the electronic circuit card guide 26 is not optimal.

Furthermore, since the contact surface areas between the electronic circuit card guide 26 and the electronic circuit card support 18 are small, the heat transfer between the electronic circuit card guide 26 and the electronic circuit card support 18 is limited, and this reduces the capacity to dissipate the heat received from the heat pipe 38.

The disclosure herein is intended to overcome the drawbacks of the prior art.

SUMMARY

To this end, the disclosure herein proposes a device for supporting and connecting electronic circuit cards, comprising:
- an electronic circuit card support which is L-shaped, having a first flange and a second flange which is approximately perpendicular to the first flange and which comprises a solid plate having at least one opening, connectors positioned on the first flange of the electronic circuit card support, at least one for each electronic circuit card, each being configured to receive a connection of an electronic circuit card;

at least one electronic circuit card guide which is positioned and fastened on the second flange of the electronic circuit card support, having a plurality of grooves, one for each electronic circuit card, each groove being configured to guide each electronic circuit in a direction of insertion towards the connector associated with it; and a system for distributing a first air flow which is received from below the electronic circuit card support and which passes through the second flange of the electronic circuit card support and the electronic circuit card guide to regulate the temperature of the electronic circuit cards.

According to the disclosure herein, the electronic circuit card guide is made of a metallic material and comprises walls for linking the grooves, these walls being solid and covering the opening(s) of the electronic circuit card support; the distribution system comprises a plurality of slots which pass through at least one wall of the electronic circuit card guide, and which are separated by fins and grouped so as to form at least one heat exchange area, each slot having a cross section smaller than that of each opening of the electronic circuit card support and being arranged and designed so as to distribute the first air flow in at least a second air flow above the electronic circuit card guide and in contact with the electronic circuit cards.

By comparison with the prior art, the electronic circuit card guide, corresponding to the element of the device for supporting and connecting electronic circuit cards in direct contact with the electronic circuit cards, comprises large surface areas in contact with the first air flow, thus promoting the dissipation of the heat emitted by the electronic circuit cards in the first air flow. According to another characteristic, the height of each slot is at least equal to the maximum height of the electronic circuit card guide.

According to another characteristic, the slots are oriented or configured in a direction perpendicular to the direction of insertion.

According to one configuration, each slot has a length of between 5 and 15 mm and a width of between 0.5 and 1.5 mm, and/or each fin has a thickness of between 0.5 and 2 mm.

According to a first embodiment, the slots are perpendicular to the second flange of the electronic circuit card support.

According to another embodiment, the slots are inclined relative to the second flange of the electronic circuit card support.

According to one arrangement, the heat exchange area(s) adjoin at least one groove receiving an electronic circuit card equipped with a heat pipe.

BRIEF DESCRIPTION OF THE DRAWINGS

Other characteristics and advantages will be apparent from the following description of the disclosure herein, this description being provided solely by way of example, with reference to the attached, example drawings, in which:

FIG. 1 is a perspective view of a device for supporting and connecting electronic circuit cards 10, showing a prior art embodiment;

FIG. 2 is a top view of an electronic circuit card guide, showing a prior art embodiment;

FIG. 3 is a perspective view of an electronic circuit card equipped with a heat pipe;

FIG. 4 is a top view of part of an electronic circuit card support, showing a prior art embodiment;

FIG. 5 is a side view of an electronic circuit card support in partial section, showing a prior art embodiment;

FIG. 6 is a perspective view of a device for supporting and connecting electronic circuit cards 10, showing an embodiment of the disclosure herein;

FIG. 7 is a perspective view of an electronic circuit card equipped with a heat pipe;

FIG. 8 is a perspective view of an electronic circuit card support, showing an embodiment of the disclosure herein;

DETAILED DESCRIPTION

Figure 9:
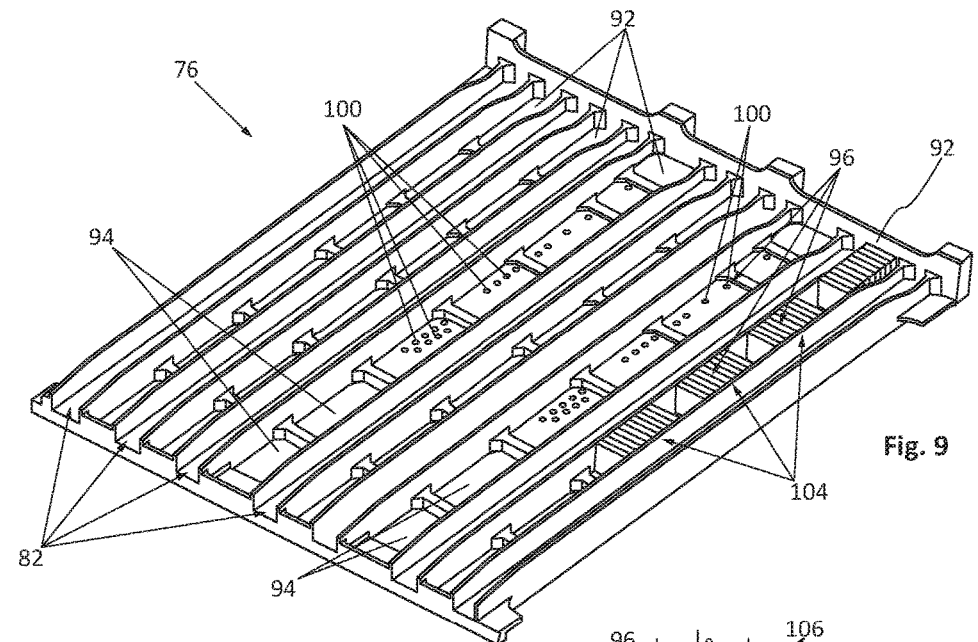
FIG. 9 is a perspective view of an electronic circuit card guide, showing an embodiment of the disclosure herein.
Figure 10:
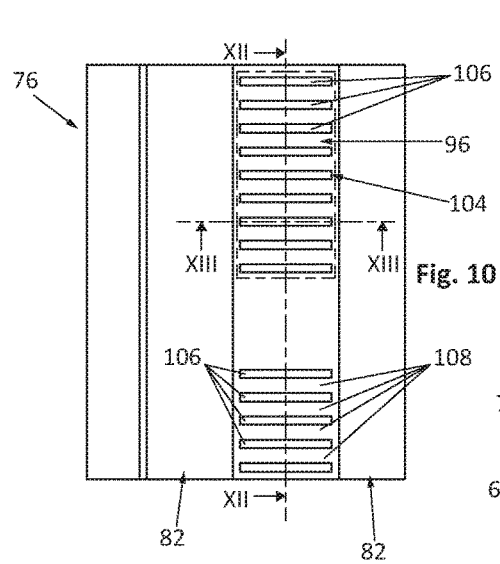
FIG. 10 is a top view of the electronic circuit card guide shown in FIG. 9.
Figure 11:
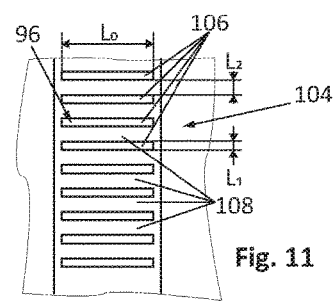
FIG. 11 is a top view of part of the electronic circuit card guide shown in FIG. 9.

According to an embodiment shown in FIG. 7, an electronic circuit card 50 comprises a board 52 on which electrical and/or electronic components are mounted, the board 52 being approximately square or rectangular in shape and having a first edge 54, on which at least one connection 56 is positioned, and a second edge 58, approximately perpendicular to the first edge 54, configured to guide the electronic circuit card 50. The electronic circuit card 50 may comprise a third edge 58', parallel to the second edge 58.

The electronic circuit card 50 comprises a system 60 for capturing heat from the electronic circuit card 50, a heat sink 62 positioned on the second edge 58 of the electronic circuit card 50, and a heat pipe 64 for guiding the heat from the capture system 60 towards the heat sink 62. According to one configuration, the heat sink 62 is a drain extending along the second edge 58 of the electronic circuit card 50.

According to one embodiment, a device 66 for supporting and connecting electronic circuit cards 50 comprises:

an electronic circuit card support 68 which is L-shaped, having a first flange 70 and a second flange 72, approximately perpendicular to the first flange 70 which is usually vertical;

connectors 74 positioned on the first flange 70 of the electronic circuit card support 68, at least one for each electronic circuit card 50, each being configured to receive the connection 56 of an electronic circuit card 50; and at least one electronic circuit card guide 76, positioned and fastened on the second flange 72 of the electronic circuit card support 68 and configured to guide each electronic circuit card 50 towards the connector 74 associated with it.

In an embodiment which is not shown, the device for supporting and connecting electronic circuit cards 66 comprises a first electronic circuit card guide 76 which is positioned and fastened on the second flange 22 of the electronic circuit card support 18, and a second electronic circuit card guide parallel to the first electronic circuit card guide 26, the electronic circuit cards 10 being inserted between the first and second electronic circuit card guides.

In one embodiment, the electronic circuit card support 68 is made of metal. Its second flange 72 comprises a solid plate 78 having at least one wide opening 80. The expression "wide opening" is taken to mean that the opening 80 has no air flow distribution function.

The second flange 72 of the electronic circuit card support 68 may comprise openings 81 configured to perform an air flow distribution function in the same way as the openings 44 provided on the second flange of an electronic circuit card support according to the prior art.

According to one embodiment, the electronic circuit card guide 76 comprises a plurality of grooves 82, one for each electronic circuit card 50, each groove 82 having a U-shaped cross section configured to house the second edge 58 of the electronic circuit card 50 and to guide the electronic circuit card 50 in a direction of insertion 84 of the electronic circuit card 50 perpendicular to the first flange 70 of the electronic circuit card support 66.

Figure 13:
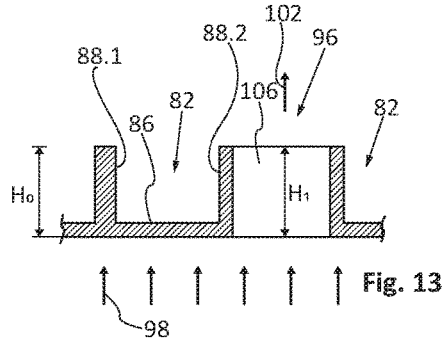
FIG. 13 is a section taken along the line XIII-XIII of FIG. 10.

As shown in FIG. 13, each groove 82 is delimited or defined by a bottom 86 and two side walls 88.1 and 88.2. In order to guide an electronic circuit card 50, the electronic circuit card guide 76 has a height $H_0$ at the side walls of about 10 mm or more.

For each electronic circuit card 50, the electronic circuit card guide 76 and/or the electronic circuit card 50 comprises a locking system 90 for immobilizing the electronic circuit card 50 and preventing the withdrawal of the connection 56 of the electronic circuit card 50 from the associated connector 74. The electronic circuit card guide 76 comprises walls 92 linking the grooves 82. These walls 92 are solid and cover the opening(s) 80 of the electronic circuit card support 68 when the electronic circuit card guide 76 is fixed to the second flange 72 of the electronic circuit card support 68. The walls 92 may have openings 94 in the areas superimposed on the plate 78 forming the second flange 72 and not having the opening(s) 80. These openings 94, like the holes 33 provided on the prior art electronic circuit card guide, do not perform an air flow distribution function.

According to one embodiment, the electronic circuit card guide 76 is made of a metallic material combining high thermal conductivity and low density. The electronic circuit card guide 76 is made of aluminum alloy.

The device 66 for supporting and connecting electronic circuit cards 50 also comprises a system 96 for distributing a first air flow 98 passing through the second flange 72 of the electronic circuit card support 68 and the electronic circuit card guide 76 to regulate the temperature of the electronic circuit cards 50. According to a characteristic of the disclosure herein, the distribution system 96 comprises a plurality of holes 100 which pass through at least one wall 92 and which are arranged and designed to distribute the first air flow 98, received from below the electronic circuit card support 68 and passing through the electronic circuit card support 68 and the electronic circuit card guide 76, in at least a second air flow 102 above the electronic circuit card guide 76 and in contact with the electronic circuit cards 50. The holes 100 of the electronic circuit card guide 76 interact with at least one opening 80 provided in the second flange 72 of the electronic circuit card support 68, the opening 80 having a cross section greater than that of each hole 100 of the electronic circuit card guide 76. To perform the distribution function, each hole 100 has a passage cross section smaller than that of each of the openings 80.

According to some embodiments, the distribution system 96 may comprise, in addition to the holes 100, openings 81 passing through the second flange 72 of the electronic circuit card support 68 which are arranged and designed to distribute the first air flow 98 and which interact with at least one opening 94 provided in the electronic circuit card guide 76, the opening 94 having a cross section greater than that of each opening 81.

The distribution system is designed to provide a suitable head loss. According to the disclosure herein, the electronic circuit card guide 76, corresponding to the element of the device 66 for supporting and connecting electronic circuit cards 50 in direct contact with the heat sink 62 of each electronic circuit card 50, performs the function of distributing the first air flow 98 and comprises surface areas in contact with the first air flow 98 which are greater than those of the prior art, thus promoting the dissipation of the heat emitted by the electronic circuit cards 50 in the first air flow 98.

Thus, according to the disclosure herein, the electronic circuit card guide 76 acts as a heat exchanger for dissipating the heat conveyed by the heat pipe(s) 64 in the first flow 98.

According to one characteristic of the disclosure herein, at least some of the holes 100 take the form of slots 106 which are grouped and separated by thin fins 108, thus forming a heat exchange area 104. By this configuration, the density of the heat exchange surfaces between the electronic circuit card guide 76 and the first air flow 98 can be increased, and ultimately the cooling capacity can also be increased.

The term "thin" is taken to mean that the fins 108 have a thickness $L_2$ (dimension measured in a direction perpendicular to the orientation of the slots 106) of less than 4 mm.

According to one configuration, these slots 106 are oriented or configured in a direction perpendicular to the direction of insertion 84.

According to one configuration, the heat exchange area(s) 104 adjoin at least one groove 82 receiving an electronic circuit card 50 equipped with a heat pipe 64.

To provide an order of magnitude, each slot 106 has a length $L_0$ (dimension measured in a direction perpendicular to the direction of insertion 84) of between 5 and 15 mm, preferably about 10 to 12 mm, a width $L_1$ (dimension measured in a direction parallel to the direction of insertion 84) of between 0.5 and 1.5 mm, preferably between 0.5 and 0.8 mm. The fins 108 have a thickness $L_2$ (dimension measured in a direction parallel to the direction of insertion 84) of between 0.5 and 2 mm, preferably about 1 mm.

The design of the slots 106 and the fins 108 is specific to each individual device 66, and is based on the amount of heat to dissipate.

According to another characteristic, the height H1 of each slot 106 (the dimension measured between the ends of the slot 106) is at least equal to the maximum height $H_0$ of the electronic circuit card guide 76 at the position of the walls 88.1 and 88.2 of the grooves 82.

This solution makes it possible to increase the surface area of the slots 106 in contact with the first air flow 98.

Figure 12A:
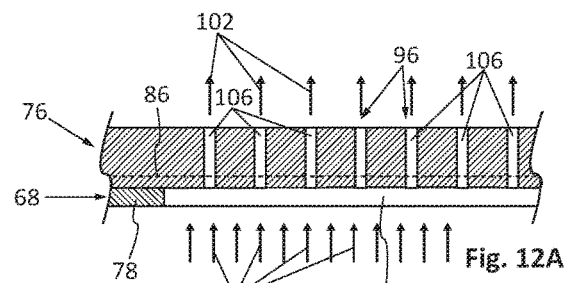
FIG. 12A is a section taken along the line XII-XII of FIG. 10, showing a first embodiment of the disclosure herein.

According to a first embodiment shown in FIG. 12A, the slots 106 are perpendicular to the second flange 72 of the electronic circuit card support 68. Thus they are oriented or configured parallel to the first air flow 98 and do not deflect it.

Figure 12B:
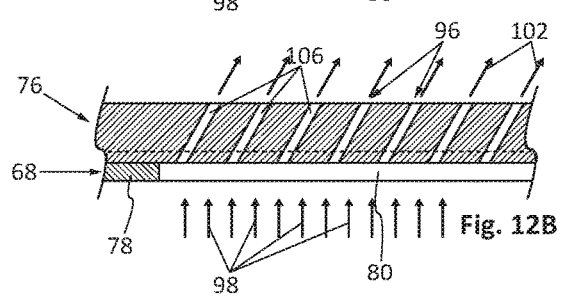
FIG. 12B is a section taken along the line XII-XII of FIG. 10, showing another embodiment of the disclosure herein.

According to a second embodiment shown in FIG. 12B, the slots 106 are inclined relative to the second flange 72 of the electronic circuit card support 68. In this configuration, the first air flow 98 is deflected.

The electronic circuit card guide 76 may be made by machining or by additive manufacturing.

While at least one exemplary embodiment of the invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A device for supporting and connecting electronic circuit cards, comprising:
   an electronic circuit card support which is L-shaped, having a first flange and a second flange which is approximately perpendicular to the first flange and which comprises a solid plate having at least one opening(s);
   connectors positioned on the first flange of the electronic circuit card support, at least one for each electronic circuit card, each being configured to receive a connection of an electronic circuit card;
   at least one electronic circuit card guide, positioned and fastened on the second flange of the electronic circuit card support, comprising a plurality of grooves, one for each electronic circuit card, each groove being configured to guide an electronic circuit card in a direction of insertion towards the connector associated with it; and
   a distribution system for distributing a first air flow received from below the electronic circuit card support and passing through the second flange of the electronic circuit card support and the electronic circuit card guide to regulate a temperature of the electronic circuit cards;
   wherein the electronic circuit card guide is made of a metallic material and comprises walls for linking the grooves, these walls being solid and covering the opening(s) of the electronic circuit card support, and wherein the distribution system comprises a plurality of slots which pass through at least one wall of the electronic circuit card guide, and which are separated by fins and grouped so as to form at least one heat exchange area, each slot having a cross section smaller than that of each opening of the electronic circuit card support and being arranged to distribute the first air flow in at least a second air flow above the electronic circuit card guide and in contact with electronic circuit card(s).

2. The device for supporting and connecting electronic circuit cards according to claim 1, wherein a height of each slot is at least equal to a maximum height of the electronic circuit card guide.

3. The device for supporting and connecting electronic circuit cards according to claim 2, wherein the slots are oriented in a direction perpendicular to the direction of insertion.

4. The device for supporting and connecting electronic circuit cards according to claim 1, wherein the slots are oriented in a direction perpendicular to the direction of insertion.

5. The device for supporting and connecting electronic circuit cards according to claim 1, wherein each slot has a length of between 5 and 15 mm and a width of between 0.5 and 1.5 mm.

6. The device for supporting and connecting electronic circuit cards according to claim 1, wherein each fin has a thickness of between 0.5 and 2 mm.

7. The device for supporting and connecting electronic circuit cards according to claim 1, wherein the slots are perpendicular to the second flange of the electronic circuit card support.

8. The device for supporting and connecting electronic circuit cards according to claim 1, wherein the slots are inclined relative to the second flange of the electronic circuit card support.

9. The device for supporting and connecting electronic circuit cards according to claim 1, wherein the heat exchange area adjoins at least one groove receiving an electronic circuit card equipped with a heat pipe.

* * * * *